United States Patent
Kao et al.

(10) Patent No.: US 7,898,820 B2
(45) Date of Patent: Mar. 1, 2011

(54) CIRCUIT BOARD AND MANUFACTURING METHOD THEREOF

(75) Inventors: Yung-Shun Kao, Taipei Hsien (TW); Hui-Ling Chung, Taipei Hsien (TW); Yu-Chiang Lu, Taipei Hsien (TW); Chung-Wei Chiang, Taipei Hsien (TW)

(73) Assignee: Giga-Byte Technology Co., Ltd, Taipei (TW)

( * ) Notice: Subject to any disclaimer, the term of this patent is extended or adjusted under 35 U.S.C. 154(b) by 372 days.

(21) Appl. No.: 12/153,419

(22) Filed: May 19, 2008

(65) Prior Publication Data

US 2009/0034214 A1 Feb. 5, 2009

(30) Foreign Application Priority Data

Jul. 30, 2007 (TW) .............................. 96127739 A

(51) Int. Cl.
 H05K 7/02 (2006.01)
 H05K 7/04 (2006.01)
(52) U.S. Cl. ........................ 361/807; 361/810; 361/720
(58) Field of Classification Search ................. 361/807, 361/810, 760, 799, 720, 736, 748; 174/50, 174/520, 521, 524; 257/734, 773, 774
See application file for complete search history.

(56) References Cited

U.S. PATENT DOCUMENTS

| | | | | |
|---|---|---|---|---|
| 4,851,614 A * | 7/1989 | Duncan, Jr. | ................. | 174/263 |
| 5,326,937 A * | 7/1994 | Watanabe | ................... | 174/263 |
| 5,414,223 A * | 5/1995 | Suski et al. | ................. | 174/262 |
| 5,420,378 A * | 5/1995 | Estes et al. | ................. | 174/263 |
| 5,668,699 A * | 9/1997 | Bell et al. | .................... | 361/753 |
| 6,295,210 B1 * | 9/2001 | Lanzone et al. | ............ | 361/799 |
| 6,497,923 B2 * | 12/2002 | Baalmann et al. | ........... | 427/488 |
| 6,710,258 B2 * | 3/2004 | Oggioni et al. | ............. | 174/255 |

* cited by examiner

*Primary Examiner*—Hung S Bui
(74) *Attorney, Agent, or Firm*—Birch, Stewart, Kolasch & Birch, LLP

(57) ABSTRACT

A circuit board is provided, comprising a substrate, a first conductive layer, at least one through hole, a protection layer, a plurality of contacts and a fixing element. The first conductive layer is formed on the substrate. The through hole is formed on the substrate and the first conductive layer. The protection layer is formed on the first conductive layer, wherein the protection layer comprises a plurality of hollow portions, the hollow portions surround the through hole, and the first conductive layer is exposed in the hollow portions. The contacts are disposed in the hollow portions, wherein the contacts are protruding from a surface of the protection layer. The fixing element is fixed in the through hole, wherein the fixing element contacts the contacts.

20 Claims, 10 Drawing Sheets

```
┌─────────────────────────────────────────────────┐
│ A circuit board is provided, comprising a substrate, a first │
│ conductive layer, a protection layer and a through hole,    │
│ the through hole passing the substrate, the first           │
│ conductive layer and the protection layer, the protection   │──S1
│ layer comprising a plurality of hollow portions, the        │
│ hollow portions surrounding the through hole, and the       │
│ first conductive layer exposed in the hollow portions       │
└─────────────────────────────────────────────────┘
                        ↓
┌─────────────────────────────────────────────────┐
│ A cover is disposed on the protection layer, wherein the    │
│ cover comprises a plurality of openings, and the            │──S2
│ openings are corresponding to the hollow portions           │
└─────────────────────────────────────────────────┘
                        ↓
┌─────────────────────────────────────────────────┐
│ Surface mount department process is preformed to the        │
│ circuit board via the cover, wherein contacts are formed    │──S3
│ in the hollow portions, and the contacts are protruded      │
│ from a surface of the protection layer                      │
└─────────────────────────────────────────────────┘
                        ↓
┌─────────────────────────────────────────────────┐
│ A fixing element is fixed in the through hole, wherein      │──S4
│ the fixing element contacts the contacts                    │
└─────────────────────────────────────────────────┘
```

FIG. 5

CIRCUIT BOARD AND MANUFACTURING METHOD THEREOF

BACKGROUND OF THE INVENTION

1. Field of the Invention

The invention relates to a circuit board, and more particularly to an easy to assemble circuit board.

2. Description of the Related Art

FIG. 1a shows a conventional circuit board 1 comprising a substrate 10, a plurality of through holes 11, a plurality of fixing elements 20 and a plurality of annular conductive pads 21. FIG. 1b is an enlarged view of portion A in FIG. 1a, wherein a protection layer 13 and a conductive layer 14 are formed on the substrate 10. The protection layer 13 comprises hollow portions 12 surrounding the through hole 11. The conductive layer 14 is exposed in the hollow portions 12. When the fixing element 20 is fixed in the through hole 11, the annular conductive pad 21 is sandwiched between the fixing element 20 and the substrate 10. The annular conductive pad 21 contacts the conductive layer 14 exposed in the hollow portions 12 to electrically connect the conductive layer 14 and the fixing element 20.

Conventionally, the annular conductive pads 21 are utilized for electrically connecting the conductive layer 14 and the fixing elements 20, which increase costs. Additionally, during assembly, the annular conductive pads 21 are easily displaced or detached, which increase difficulty of circuit board assembly.

BRIEF SUMMARY OF THE INVENTION

A detailed description is given in the following embodiments with reference to the accompanying drawings.

A circuit board is provided, comprising a substrate, a first conductive layer, at least one through hole, a protection layer, a plurality of contacts and a fixing element. The first conductive layer is formed on the substrate. The through hole is formed on the substrate and the first conductive layer. The protection layer is formed on the first conductive layer, wherein the protection layer comprises a plurality of hollow portions, the hollow portions surround the through hole, and the first conductive layer is exposed in the hollow portions. The contacts are disposed in the hollow portions, wherein the contacts are protruding from a surface of the protection layer. The fixing element is fixed in the through hole, wherein the fixing element contacts the contacts.

In the invention, the contacts are formed during the circuit board manufacturing process, and annular conductive pads are omitted. Therefore, cost is decreased, and manufacturing process is simplified. Additionally, the contacts provide sufficient strength to resist pressure applied by the fixing element (bolt) preventing the circuit board from scratch. In the invention, the contacts can resist pressure of 12 kg/cm².

BRIEF DESCRIPTION OF THE DRAWINGS

The invention can be more fully understood by reading the subsequent detailed description and examples with references made to the accompanying drawings, wherein:

FIG. 1b is an enlarged view of portion A in FIG. 1a;

FIG. 5 shows a circuit board manufacturing method of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
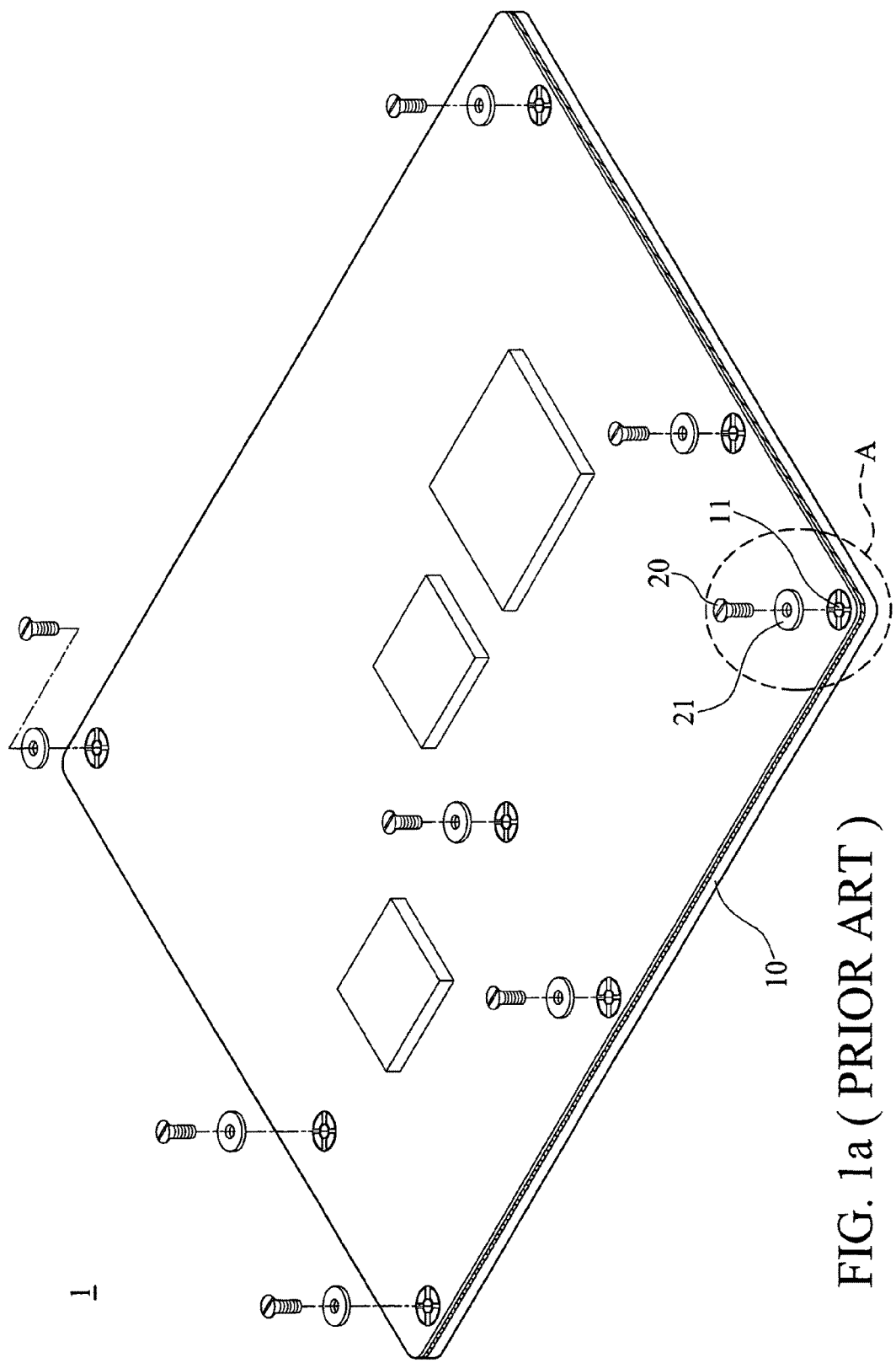
FIG. 1a shows a conventional circuit board.
Figure 1B:
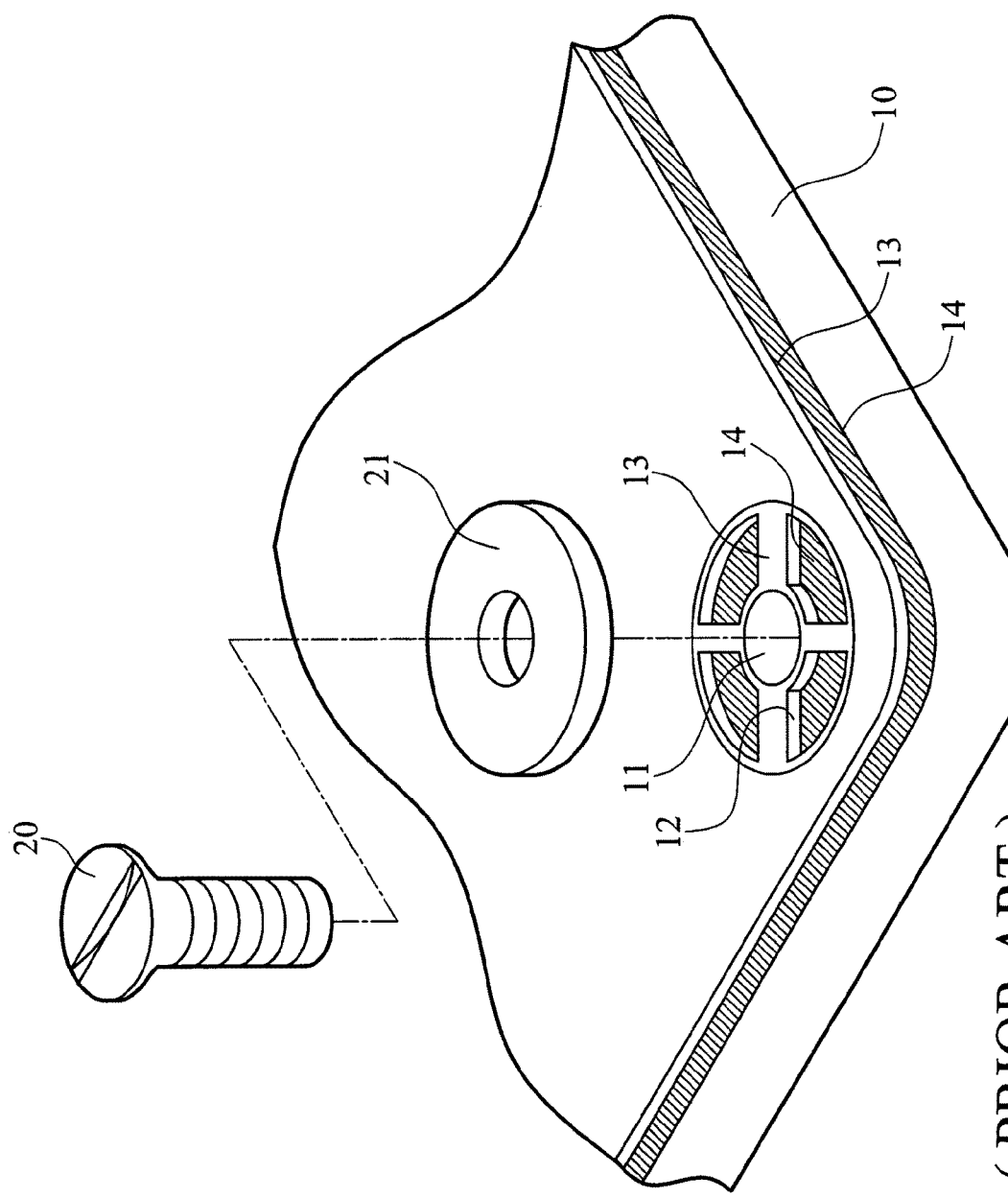
Figure 2:
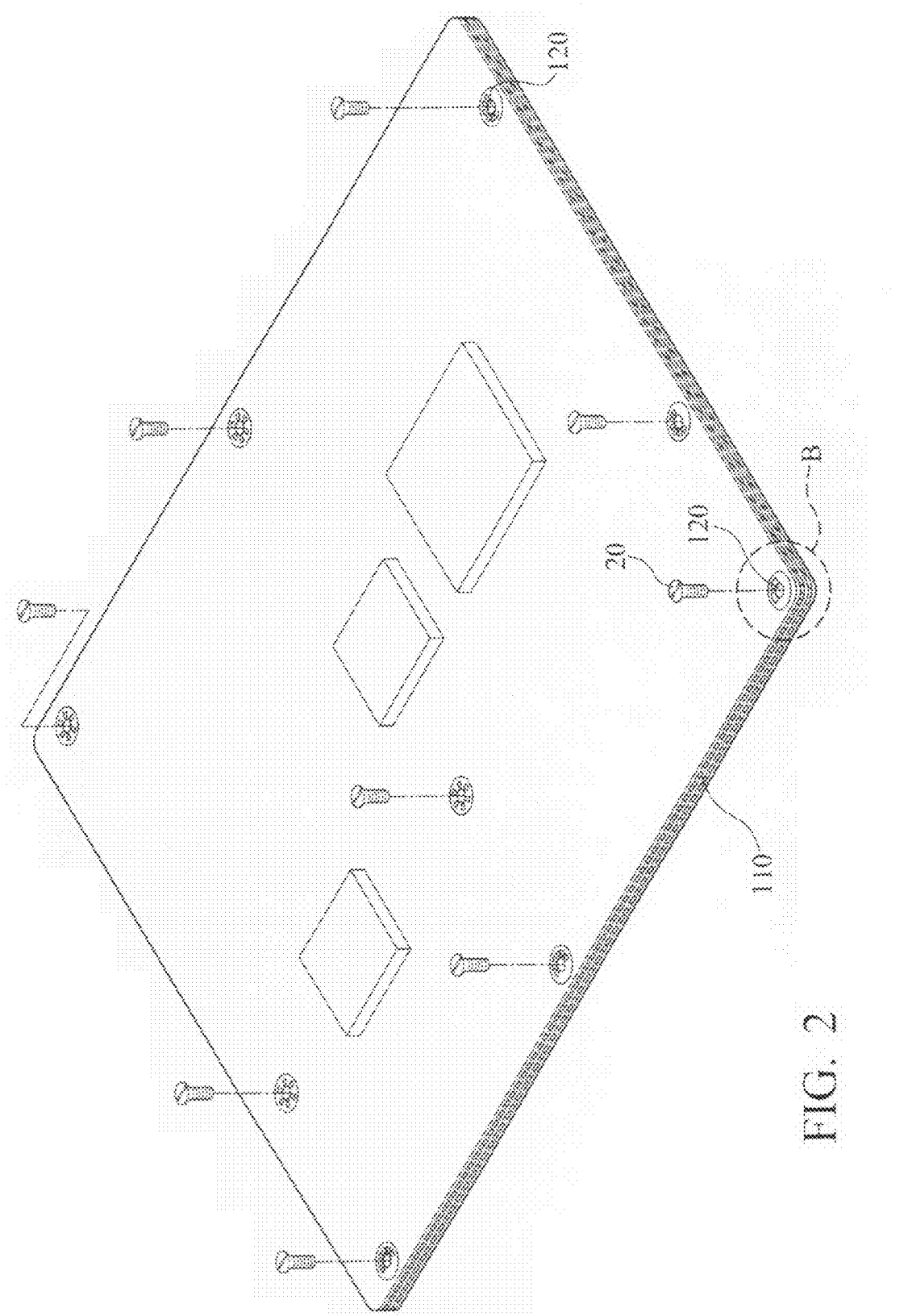
FIG. 2 shows a circuit board of the invention.
Figure 3:
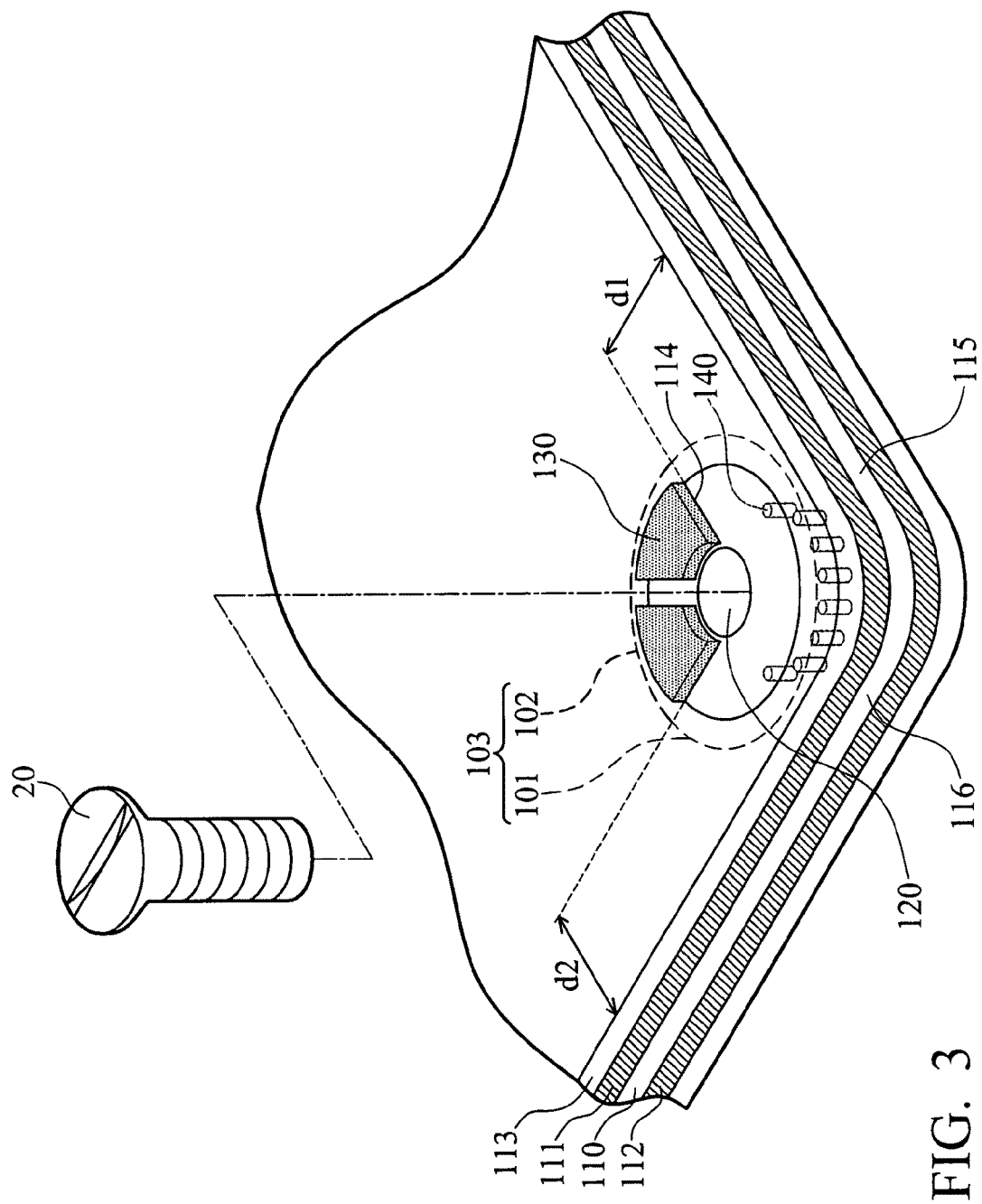
FIG. 3 is an enlarged view of portion B in FIG. 2.

FIG. 2 shows a circuit board 100 of the invention comprising a substrate 110, a plurality of through holes 120 and a plurality of fixing elements 20. FIG. 3 is an enlarged view of portion B in FIG. 2, wherein the circuit board 100 further comprises a first conductive layer 111, a second conductive layer 112, a production layer 113 and contacts 130. The first conductive layer 111 and the second conductive layer 112 are formed on the surfaces of the substrate 110, and separated thereby. The through hole 120 passes through the substrate 110, the first conductive layer 111, the second conductive layer 112 and the protection layer 113. The protection layer 113 is formed on the first conductive layer 111. The protection layer 113 comprises a plurality of hollow portions 114 surrounding the through hole 120. The first conductive layer 111 is exposed in the hollow portions 114. The contacts 130 are filled in the hollow portions 114. The contacts 130 are protruding from the surface of the protection layer 113. The fixing element 20 is fixed in the through hole 120. The fixing element 20 contacts the contacts 130. The contacts 130 electrically connect the fixing element 20 and the first conductive layer 111 to ground the first conductive layer 111 and reduce electro-magnetic interference.

In the embodiment of the invention, the through holes 120 are thread holes, the fixing elements 20 are screw bolts, the contacts 130 comprise of tin, and the protection layer 113 is solder-repellent lacquer.

With reference to FIG. 3, the circuit board 100 further comprises annular areas 103. Each annular area 103 comprises a via area 101 and a contact area 102. The annular area 103 surrounds the through hole 120. The hollow portions 114 are located in the contact area 102. The via area 101 comprises a plurality of via holes 140 surrounding the through hole 120. The via holes 140 electrically connect the first conductive layer 111 and the second conductive layer 112 to ground the second conductive layer 112 through the first conductive layer 111, the contacts 130 and the fixing element 20 and reduce electro-magnetic interference.

The hollow portions 114 are fan-shaped, and surround the through hole 120 radially.

The substrate 111 comprises a first edge 115 and a second edge 116. The distance d1 between the contacts 130 and the first edge 115 is no less than a holding reserve distance. The distance d2 between the contacts 130 and the second edge 116 is no less than the holding reserve distance. In the embodiment, the holding reserve distance is about 5 mm.

Figure 4A:
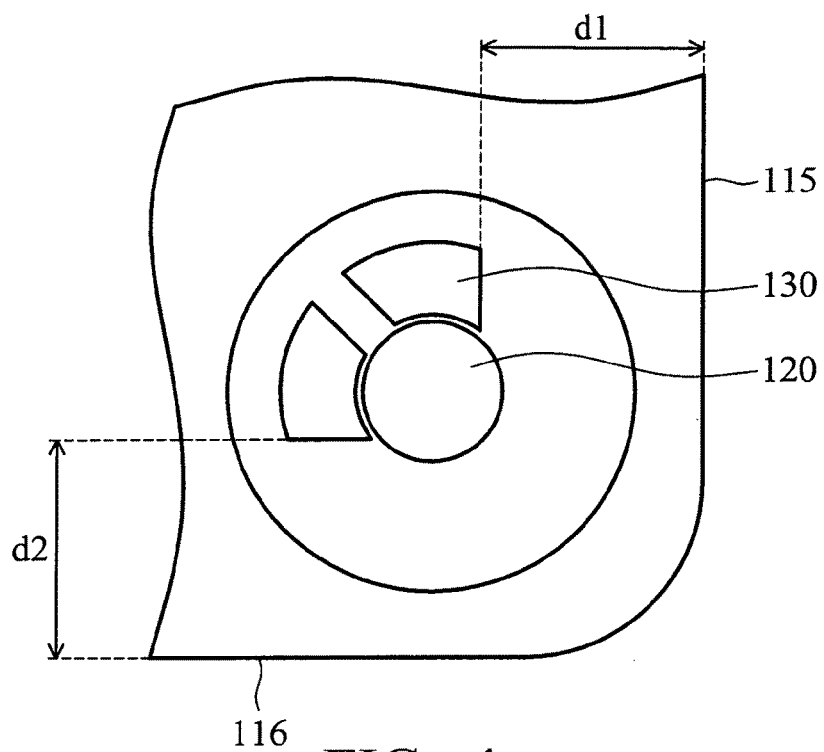
FIG. 4a shows distribution of the contacts when the through hole is located at a corner of the circuit board.
Figure 4B:
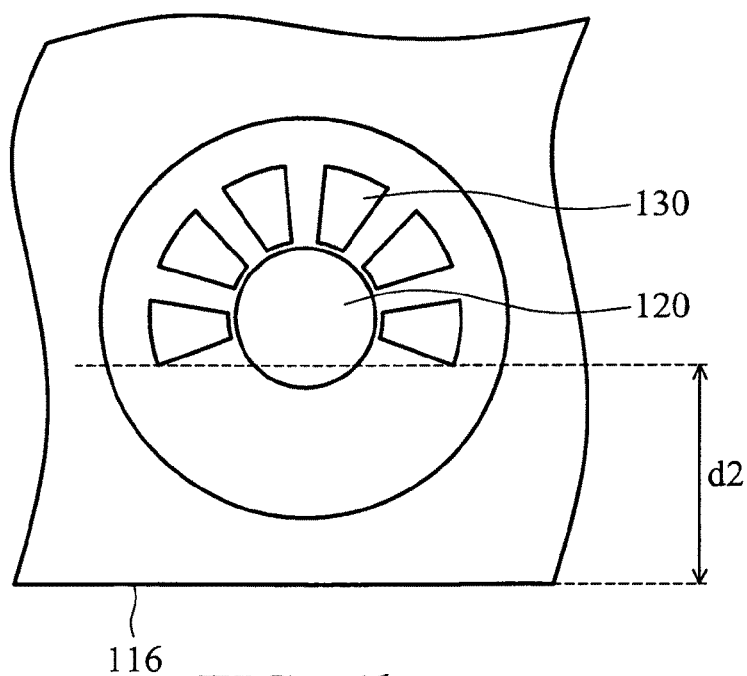
FIGS. 4b and 4c show distribution of the contacts when the through hole is located near an edge of the circuit board.
Figure 4C:
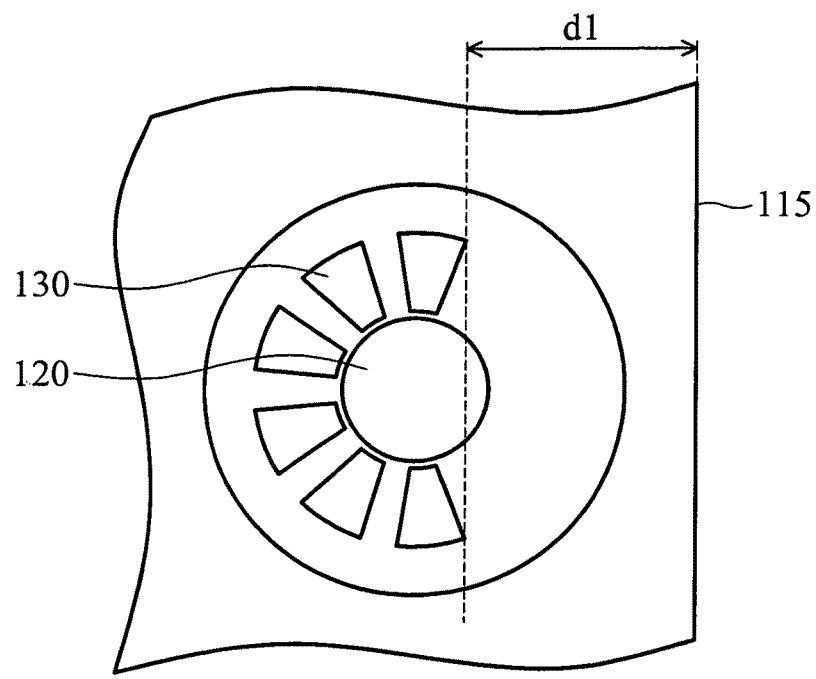

FIG. 4a shows distribution of the contacts 130 when the through hole 120 is located at a corner of the circuit board. FIGS. 4b and 4c show distribution of the contacts 130 when the through hole 120 nears an edge of the circuit board. FIG.

Figure 4D:
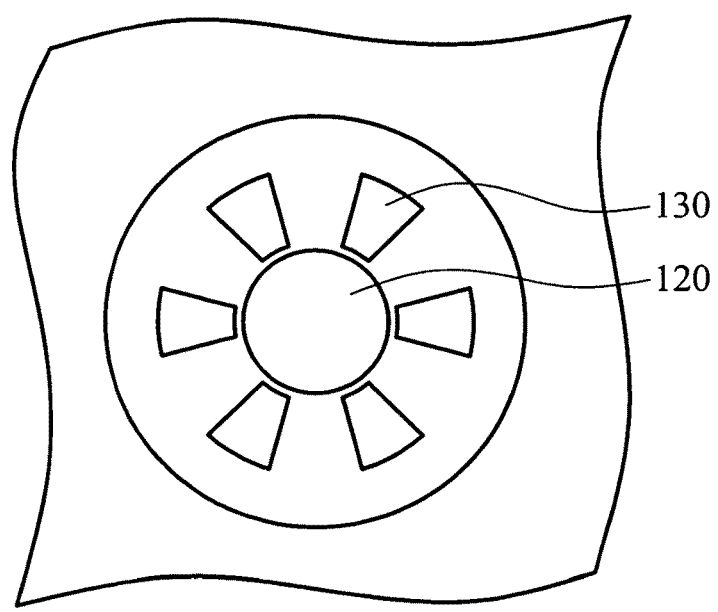
FIG. 4d shows distribution of the contacts when the through hole is located at the center of the circuit board.

4d shows distribution of the contacts 130 when the through hole 120 is located at the center of the circuit board. The contacts 130 radially and equidistantly surround the through hole 120. With reference to FIG. 4a, when the through hole 120 is located at a corner of the circuit board, the amount of the contacts 130 is two. With reference to FIGS. 4b and 4c, when the through hole 120 is located near an edge of the circuit board, the amount of the contacts 130 is six. With reference to FIG. 4d, when the through hole 120 is located at the center of the circuit board, the amount of the contacts 130 is six.

FIG. 5 shows a circuit board manufacturing method of the invention. First, a circuit board is provided, comprising a substrate, a first conductive layer, a protection layer and a through hole, the through hole passes through the substrate, the first conductive layer and the protection layer, the protection layer comprises a plurality of hollow portions, the hollow portions surround the through hole, and the first conductive layer is exposed in the hollow portions (S1). Then, a cover is disposed on the protection layer, wherein the cover comprises a plurality of openings, and the openings are corresponding to the hollow portions (S2). Next, surface mount department process is preformed to the circuit board via the cover, wherein contacts are formed in the hollow portions, and the contacts are protruding from a surface of the protection layer (S3). Finally, a fixing element is fixed in the through hole, wherein the fixing element contacts the contacts (S4).

In the circuit board manufacturing method mentioned above, the square measure of the opening is greater than that of the hollow portion. When the contacts (tin contacts) are formed in the hollow portions through the openings, tin material agglomerates by surface tension and cold shrink to form the contacts protruding from the surface of the protection layer.

Figure 6:
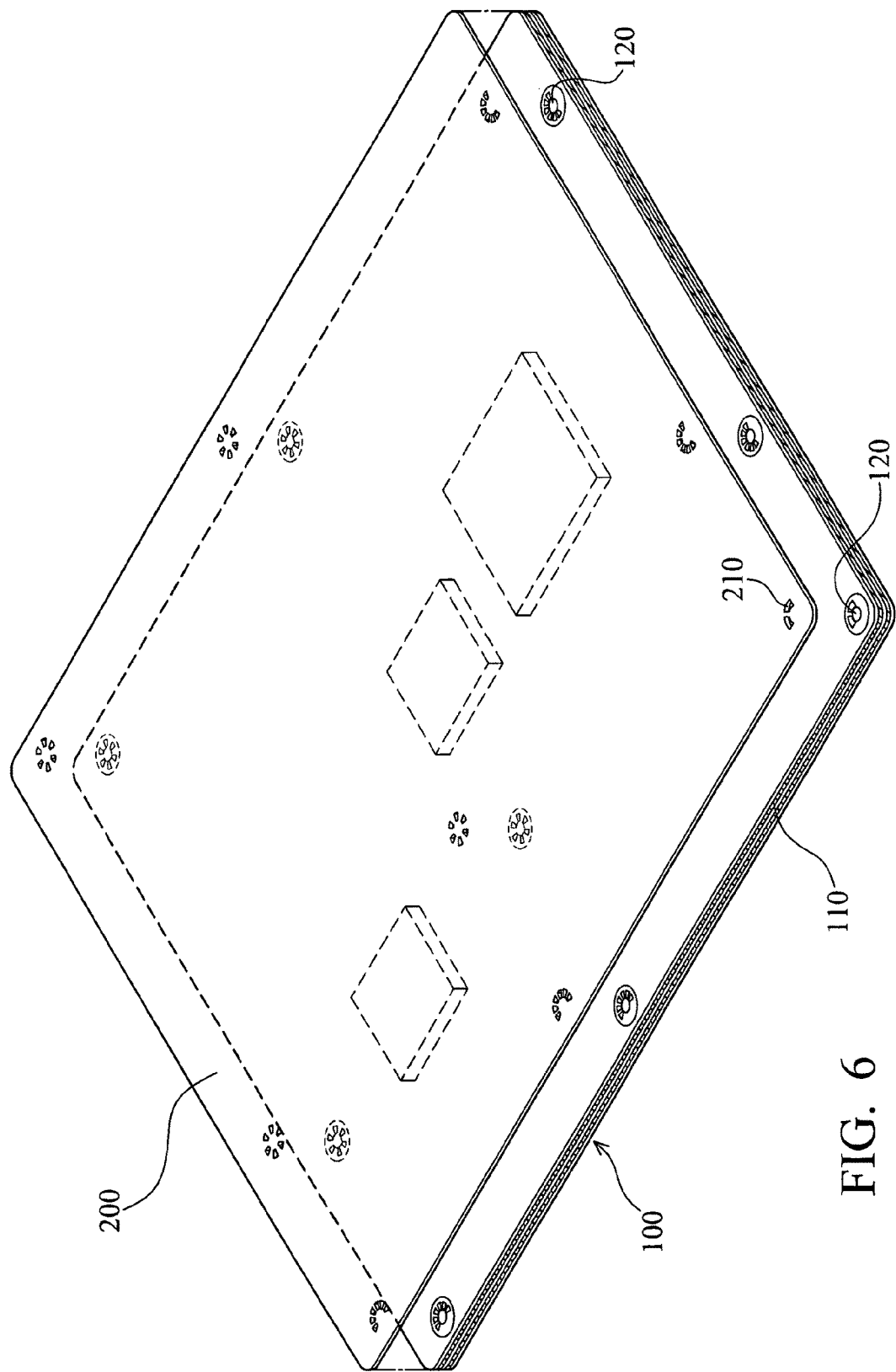
FIG. 6 shows the cover located on the circuit board.
Figure 7A:
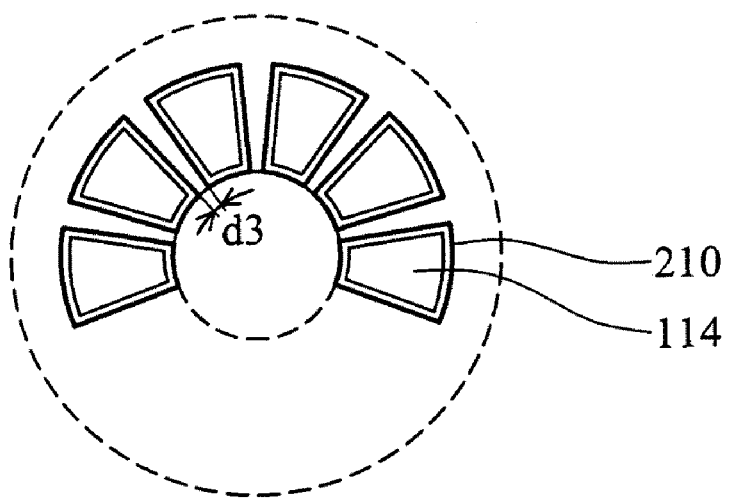
FIGS. 7a-7c show the openings corresponding to the hollow portions.
Figure 7B:
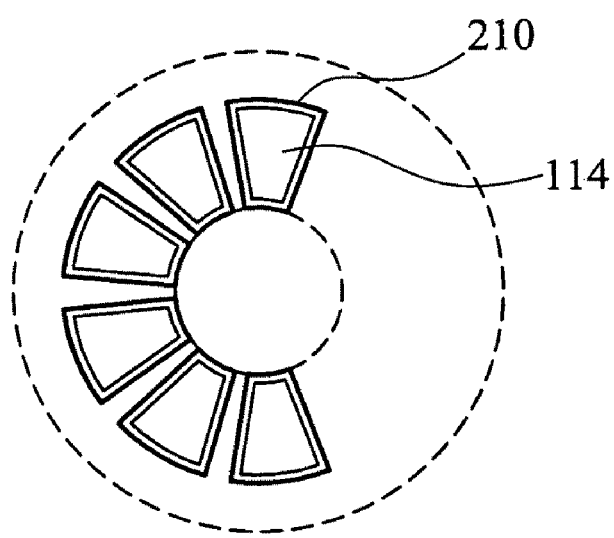
Figure 7C:
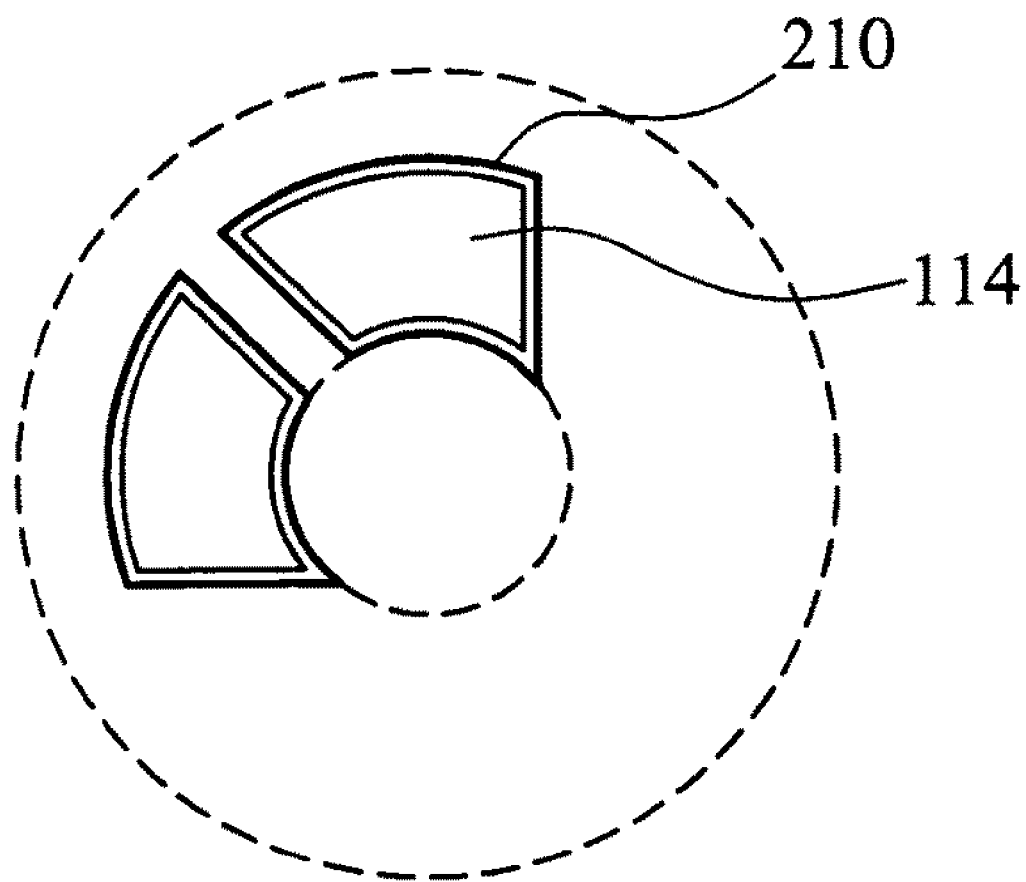

FIG. 6 shows the cover 200 located on the circuit board 100, wherein the cover comprises openings 210. FIGS. 7a-7c show the openings 210 corresponding to the hollow portions 114. A ratio between square measures of the openings 210 and the hollow portions 114 is 1:0.7~1:0.85, for example, 1:0.8. The distance d2 between the openings 210 is no less than 0.3 mm.

In the invention, the contacts are formed during the circuit board manufacturing process, and annular conductive pads are omitted. Therefore, cost is decreased, and manufacturing process is simplified. Additionally, the contacts provide sufficient strength to resist pressure applied by the fixing element (bolt) preventing the circuit board from scratch. In the invention, the contacts can resist pressure of 12 kg/cm$^2$.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit board, comprising:
   a substrate;
   a first conductive layer, formed on the substrate;
   at least one through hole, formed on the substrate and the first conductive layer;
   a protection layer formed on the first conductive layer, wherein the protection layer comprises a plurality of hollow portions, the hollow portions surround the through hole, and the first conductive layer is exposed in the hollow portions;
   a plurality of contacts, disposed in the hollow portions, wherein each contact is filled into a recess formed by the hollow portion and the first conductive layer, and the contacts are protruding from a surface of the protection layer; and
   a fixing element, fixed in the through hole, wherein the fixing element contacts the contacts.

2. The circuit board as claimed in claim 1, wherein the through hole is a thread hole, and the fixing element is a screw bolt.

3. The circuit board as claimed in claim 1, wherein the contacts comprise of tin.

4. The circuit board as claimed in claim 1, wherein the protection layer is solder-repellent lacquer.

5. The circuit board as claimed in claim 1, further comprising a second conductive layer and a plurality of via holes, wherein the via holes connect the first and second conductive layers, and surround the through holes.

6. The circuit board as claimed in claim 5, further comprising an annular area, wherein the annular area comprises a via area and a pad area, the annular area surrounds the through hole, the hollow portions are located in the pad area, and the via holes are located in the via area.

7. The circuit board as claimed in claim 1, wherein the hollow portions and the contacts are fan-shaped, and the hollow portions radially surround the through hole.

8. The circuit board as claimed in claim 1, wherein the hollow portions and the contacts are fan-shaped and the hollow portions equidistantly surround the through hole.

9. The circuit board as claimed in claim 1, wherein the hollow portions and the contacts are fan-shaped, the substrate comprises a first edge, and a distance between the contacts and the first edge is no less than a holding reserve distance.

10. The circuit board as claimed in claim 9, wherein the holding reserve distance is about 5 mm.

11. The circuit board as claimed in claim 9, wherein an amount of the contacts is six.

12. The circuit board as claimed in claim 9, wherein the substrate further comprises a second edge, a distance between the contacts and the second edge is no less than the holding reserve distance, and the first edge is perpendicular to the second edge.

13. The circuit board as claimed in claim 12, wherein an amount of the contacts is two.

14. A circuit board manufacturing method, comprising:
   providing a circuit board, comprising a substrate, a first conductive layer, a protection layer and a through hole, the through hole passing through the substrate, the first conductive layer and the protection layer, the protection layer comprising a plurality of hollow portions, the hollow portions surround the through hole, and the first conductive layer is exposed in the hollow portions;
   disposing a cover on the protection layer, wherein the cover comprises a plurality of openings, and the openings are corresponding to the hollow portions;
   performing a surface mount department process to the circuit board via the cover, wherein a plurality of contacts are formed in the hollow portions, each contact is filled into a recess formed by the hollow portion and the first conductive layer, and the contacts are protruding from a surface of the protection layer; and
   fixing a fixing element in the through hole, wherein the fixing element contacts the contacts.

15. The circuit board manufacturing method as claimed in claim 14, wherein the through hole is a thread hole, and the fixing element is a screw bolt.

16. The circuit board manufacturing method as claimed in claim 14, wherein the contacts comprise of tin.

17. The circuit board manufacturing method as claimed in claim 14, wherein the protection layer is solder-repellent lacquer.

18. The circuit board manufacturing method as claimed in claim 14, wherein the hollow portions and the contacts are fan-shaped, and the hollow portions radially surround the through hole.

19. The circuit board manufacturing method as claimed in claim 14, wherein a ratio between square measures of the openings and the hollow portions is 1:0.7~1:0.85.

20. The circuit board manufacturing method as claimed in claim 14, a ratio between square measures of the openings and the hollow portions is 1:0.8.

* * * * *